United States Patent [19]
Snyder

[11] Patent Number: 6,140,574
[45] Date of Patent: *Oct. 31, 2000

[54] METHOD AND APPARATUS FOR PLATED EMI HOUSING WITH INTEGRATED POSITIVE CONTACT

[75] Inventor: Roderick Lee Snyder, Vinton, Va.

[73] Assignee: ITT Manufacturing Enterprises, Inc., Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/934,966

[22] Filed: Sep. 22, 1997

[51] Int. Cl.$^7$ .................................................. H05K 9/00
[52] U.S. Cl. .................................. 174/35 R; 250/214 VT
[58] Field of Search ........................ 174/35 R, 35 MS; 315/85; 313/479; 361/816, 818; 250/214 VT

[56] References Cited

U.S. PATENT DOCUMENTS

4,924,080  5/1990  Caserta et al. ...................... 250/214 VT

*Primary Examiner*—Dean A. Reichard
*Assistant Examiner*—Hung V Ngo
*Attorney, Agent, or Firm*—McDermott, Will & Emery

[57] ABSTRACT

A monlithic housing assembly for an electronic device for providing electromagnetic interference (EMI) protection and positive and negative contact areas. The housing includes a hollow substantially cylindrical tube of uniform diameter for receiving the electronic device. The tube includes a first cylindrical outer surface comprising a first conductively plated portion defining a negative contact area and a second machined portion defining a positive contact area. The tube further includes a plurality of slot holes in the second machined portion which extend into the first conductively plated portion for receiving capacitive elements to provide EMI protection for the electronic device. First and second bore holes are located in respective first conductively plated portion and positive contact area for receiving corresponding negative and positive voltage terminals from the electronic device. A method for making is also disclosed.

17 Claims, 8 Drawing Sheets

(PRIOR ART)

METHOD AND APPARATUS FOR PLATED EMI HOUSING WITH INTEGRATED POSITIVE CONTACT

FIELD OF THE INVENTION

The invention relates to housing assemblies for electronic devices and, more particularly, to housing assemblies for image intensifier tubes which provide both EMI protection and integrated positive and negative contact areas for operating such devices.

BACKGROUND OF THE INVENTION

Image intensifier devices multiply the amount of incident light they receive and provide an increase in light output, which can be supplied either to a camera or directly to the eyes of a viewer. These devices are particularly useful for providing images from dark regions and have both industrial and military applications. For example, image intensifiers are used in night vision goggles for enhancing the night vision of aviators and other military personnel performing covert operations. They are employed in security cameras and in medical instruments to help alleviate conditions such as retinitis pigmentosis (night blindness). Such an image intensifier device is exemplified by U.S. Pat. No. 5,084,780 entitled TELESCOPIC SIGHT FOR DAY/NIGHT VIEWING by Earl N. Phillips issued on Jan. 28, 1992 and assigned to ITT Corporation the assignee herein.

Image intensifiers include three main components, namely a photocathode, a phosphor screen and a microchannel plate (MCP) positioned between the screen and the photocathode. The MCP is a thin glass plate having an array of microscopic holes through it. Each hole is capable of acting as a channel-type secondary emission electron amplifier. The cathode detects a light image and changes the light image into an electron image. The MCP amplifies the electron image and the screen changes the electron image back to an light image. Gains up to several thousand can be achieved when the microchannel plate is placed in the plane of an electron image in the intensifier tube. Since each channel in an MCP operates nearly independently of all the others, a bright point source of light will saturate a few channels but will not spread out over adjacent areas. This characteristic of "local saturation" makes tubes more immune to blooming at bright areas.

When an image intensifier tube without EMI protection is operated in an electromagnetic field, such as in the vicinity of an operating high power radio or radar transmitter, the image intensifier suffers degradation in performance. The output often goes black or very bright, or some point in between, depending on the design of the power supply. Increased brightness is distracting and in extreme situations may cause the user to lose all contrast, producing a blank viewing screen. Thus, image intensifier tubes conventionally employ a housing assembly for protection from electromagnetic interference as well as from environmental conditions. For an example of prior art devices employing EMI protective housing assemblies and methods of making, reference is made to U.S. Pat. No. 4,924,080, issued to Joseph N. Caserta et al., on May 8, 1990, entitled ELECTROMAGNETIC INTERFERENCE PROTECTION FOR IMAGE INTENSIFIER TUBE, and assigned to ITT Corporation, the assignee herein.

In the prior art, the housing assemblies for image intensifier tubes which provided EMI protection consisted of a non-conductive (generally plastic) tube which was coated on the exterior surface with a conductive material such as silver, copper, or aluminum to provide good protective shielding. The tube contained an opening for a contact sub-assembly which included a separate positive contact (often gold plated brass) with four ceramic chip capacitors soldered to the edges to filter the image intensifier tube's power supply and short the EMI through the capacitors. This sub-assembly was then soldered to the plated plastic housing. However, significant problems exist with this apparatus and method for providing EMI protection. First, prior to the housing being plated, a chemical masking is painted onto certain areas of the tube in order to prevent adherence of plating to those areas which must remain electrically separated or insulated. The chemical masking used to prevent plating in certain areas can often react with the potting used to secure the image intensifier within the housing so as not to allow a full cure (wet potting), thereby permitting movement of the device within the housing and potential optical misalignment. Furthermore, the use of the complex chemical masking regularly results in electrical failures or shorts due to plating in areas that need to be electrically separated, resulting in both lower yields from housing suppliers and greater rejects at the assembly area. Moreover, the use of a separate positive contact allows for variation in the height of the contact off of the surface of the housing. This is a critical interface dimension, requiring strict control and supervision during the manual assembly process. The use of the separate contact thus requires a complex and time consuming assembly operation by a highly skilled operator in order to achieve proper mounting of the contact. Finally, the use of a gold plated contact to act as a positive contact area coupled with the complex chemical masking process and manual assembly results in high manufacturing costs.

Accordingly, a need exists for a method which allows the housing to be plated without the need for a chemical masking process. Moreover, eliminating the separate gold-plated positive contact and its intricate assembly within the housing to reduce costs and increase manufacturing efficiency is highly desirable.

SUMMARY OF THE INVENTION

It is an object of the present invention to provide a method for providing electromagnetic interference (EMI) protection of an electronic device having positive and negative voltage terminals. The method comprises the steps of forming a housing for said electronic device, boring a plurality of slot holes and feed through holes in the housing, filling the interior of the housing with a removable protective material to prevent plating of the interior of the housing, plating the outer surface of with a conductive shielding material to provide a negative contact area, and machining a portion of the plated outer surface of to remove the plating to provide an electrically isolated positive contact area on the housing, where the positive contact area is in electrical contact with the plurality of slot holes. The method further includes disposing capacitive elements within said plurality of slot holes to provide EMI protection of said electronic device and electrically connecting said capacitive elements to the interior of said housing, removing said protective material from the interior of said housing and inserting said device into the interior of said housing, and connecting the positive and negative terminals of said device to the positive contact area and negative contact area, respectively to provide a voltage potential for biasing the electronic device.

It is also an object of the present invention to provide a monolithic housing assembly for an electronic device for providing electromagnetic interference (EMI) protection and positive and negative contact areas. The housing comprises a hollow substantially cylindrical tube of uniform diameter for receiving the electronic device. The tube includes a first cylindrical outer surface comprising a first conductively plated portion defining a negative contact area and a second machined portion defining a positive contact area. The tube further includes a plurality of slot holes in the second machined portion which extend into the first conductively plated portion for receiving capacitive elements to provide EMI protection for the electronic device. First and second bore holes are located in respective first conductively plated portion and positive contact area for receiving corresponding negative and positive voltage terminals from the electronic device.

BRIEF DESCRIPTION OF THE DRAWINGS

The invention is to be explained in more detail below based on embodiments depicted in the following figures where.

DETAILED DESCRIPTION OF THE INVENTION

Figure 1:
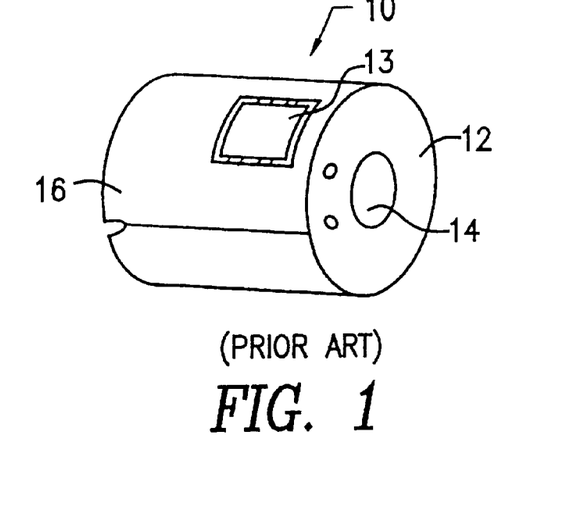
FIG. 1 is a perspective view of a power supply and prior art housing of an image intensifier device.

In FIG. 1 there is shown a perspective view of a prior art image intensifier tube assembly 10. The image intensifier tube assembly 10 includes a power supply 12, a fiber optic output window 14, a housing 16 and an energy input tab 13.

Figure 2:
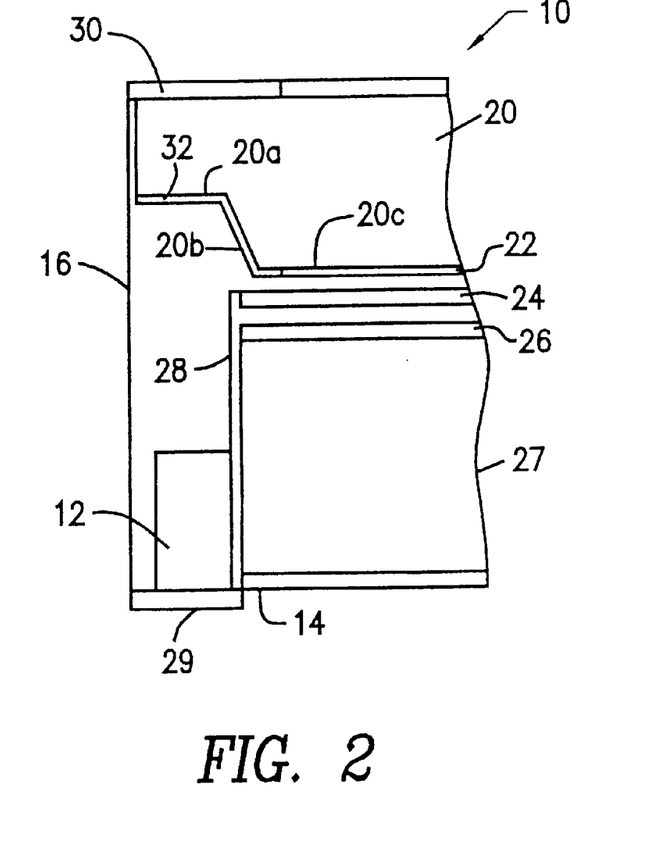
FIG. 2 is a cross sectional view of a conventional image intensifier.

FIG. 2 is a cross-sectional view of a conventional image intensifier tube assembly 10 showing the major components thereof. The tube assembly 10 can be seen to comprise three basic components: a photocathode including a photoemissive wafer 22 coated on a faceplate 20; a microchannel plate 24 and an anode including a phosphor screen 26 which is deposited on a fiber-optic output window 28. A vacuum tube extends from the MCP 24 to the output window 14. A retainer ring 29 seals the end of the tube adjacent to the power supply 12. Both the faceplate and the output window are preferably formed from glass of high optical quality. The microchannel plate is also formed of a glass material which possesses a secondary emissive property and conductive characteristics.

The faceplate 20 receives and transmits light. It is normally sealed within the housing 16 and is surrounded by a peripheral flange 30. Light rays penetrate the faceplate 20 and are directed to the photoemissive wafer 22 which transforms the photons of light into electrons.

The electrons are transmitted to the MCP 24 which operates to multiply the number of electrons, all in accordance with known principles. The usual photoemissive wafer is a suitable gallium arsenide (GaAs) device, but other suitable materials can be used. Connecting the photoemissive material 22 to an external biasing power supply 12 is a coating of conductive material 32 applied to surfaces 20a, 20b and a portion of 20c of the faceplate 20. The microchannel plate is mounted in the tube with both its input and output faces parallel to the photoemissive wafer 22 and the phosphor screen 26, respectively.

An image intensifier tube assembly such as an MX-1060 Image Intensifier Tube is a self-contained unit with an integral high-voltage power supply. The power supply 12 includes automatic brightness control to provide a constant output image brightness over five orders-of-magnitude input illumination change as well as bright source protection to protect the photocathode 20 during exposure to high levels of light.

Energy is supplied to the power supply 12 by an external source, such as a battery (not shown). The battery supplies DC voltage to the power supply which converts the DC voltage to AC by known means. Although the current is low, the voltage supplied to the image intensifier components is relatively high, i.e., up to approximately 9000 volts. Voltage is supplied from the power supply 12 to the photoemissive wafer 22, the MCP 24 and the phosphor screen 26.

In operation, a radiation image impinging on the photocathode 20 causes the emission of electrons which are attracted to the MCP which is maintained at the higher positive potential than the photocathode 20. Each electron impinging on the MCP 24 results in the emission of a number of secondary electrons which in turn causes the emission of more secondary electrons. The electron gain or multiplication within the MCP 24 is controlled primarily by the potential difference applied across input and output surfaces of the MCP 24. The electrons emanating from MCP 24 and containing the input radiation image information impinge on phosphor screen 26 causing the screen to fluoresce and reproduce the input image.

Figure 3:
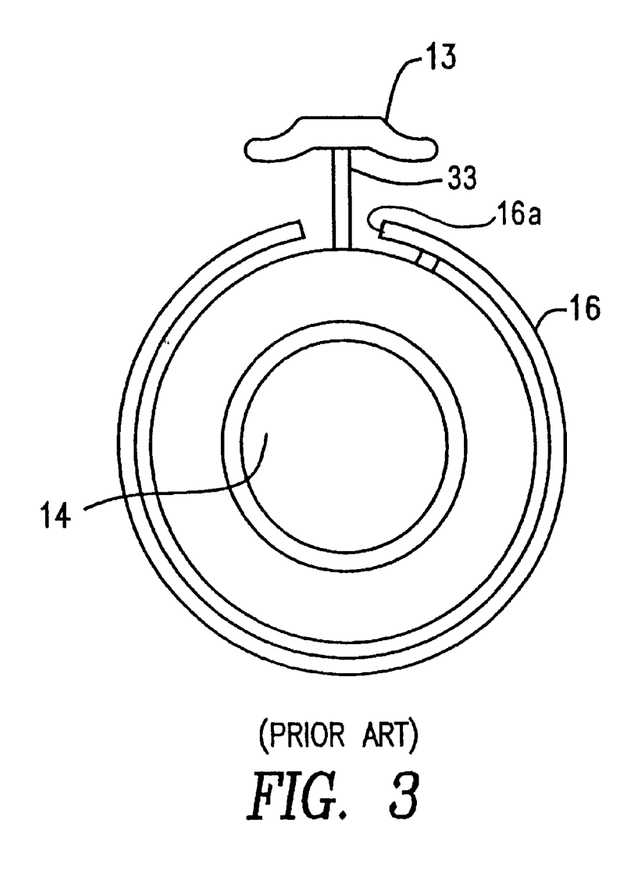
FIG. 3 is an end view of the power supply and prior art housing.
Figure 3A:
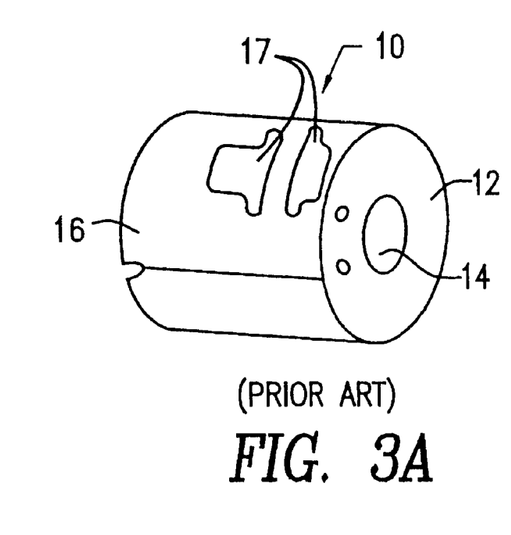
FIG. 3A is a perspective view of the prior art housing of FIG. 1 illustrating the openings on the surface of the housing.

As shown in FIG. 3 (prior art), the prior art housing 16 is generally formed of a nonconductive material, such as plastic. The housing 16 has an opening 17 for the insertion of an energy input tab 13. FIG. 3A (prior art) provides a perspective view of the opening 17 in the prior art housing for receiving the energy input tab 13, wherein like parts are indicated by like reference numerals. The energy input tab 13 is joined to the inner surface of the housing 16. When the energy input tab 13 is in position in the housing 16, the tab is electrically isolated from the remainder of the housing. Positive lead 33 extends between the power supply 12 and the energy input tab 13.

When the tube is operated in high electromagnetic fields (exceeding 20 volts/meter) the image intensifier will change in output brightness. This is due to electromagnetic energy which enters the image intensifier through the plastic housing and through the DC battery input.

Shielding is accomplished in the following manner. The outside surface of housing 16 is coated with an electrically conductive material. The conductive material is spaced from the power input tab 13. In addition the retainer ring 29 and flange 30 also have the conductive coating applied thereto in order to protect the ends of the tube assembly. The coating may be applied in any suitably manner, for example, electroplating. The conductive material forms a continuous coating protected from corrosion and capable of forming a good solderable connection.

Filtering of the power supply is accomplished by using distributed capacitance to short the EMI from the positive lead 33 to the metallized contact housing 16 which is thus grounded. It has been found that a capacitor represents a very low impedance (or short circuit) to high frequency which directs substantially all of the EMI away from the tube assembly. The small percentage of radio frequency that is not reflected by this arrangement is attenuated by the insertion-loss components in the power supply.

Figure 4:
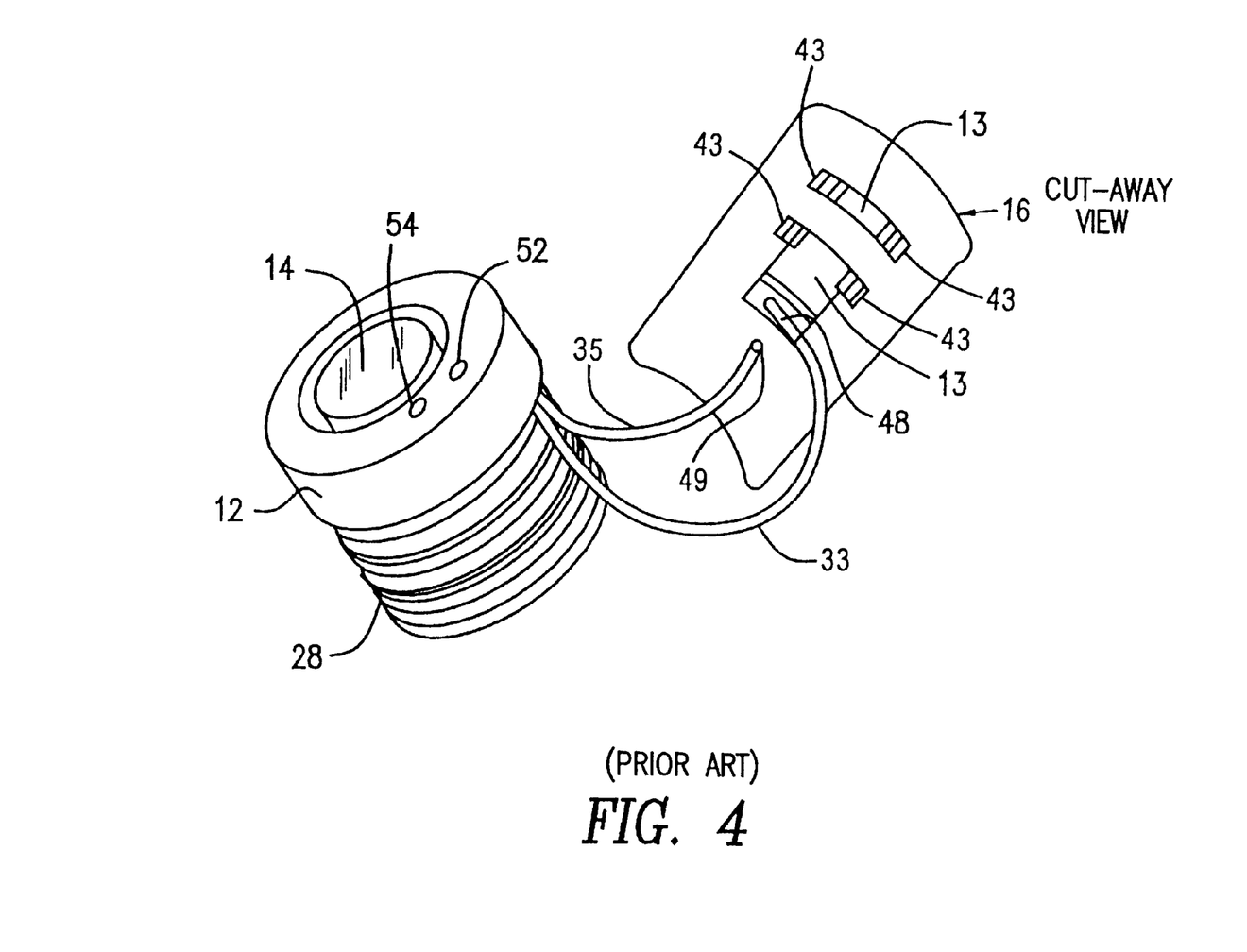
FIG. 4 is a view of the prior art housing and image intensifier filter including a cut-away view of the housing.

Reference will now be made to FIG. 4 (prior art) which show a conventional arrangement for the filtering of the tube assembly 10. In this arrangement four discrete 0.01 microfarad capacitors 43 are positioned on the inside surface of the housing 16. The capacitors are each joined at one end to the energy input tab 13 and at the other end to the metallized portion of the housing 16. Positive lead 33 extends between the power supply 12 and is soldered to input tab 13 at contact 48. The negative lead 35 extends between the power supply 12 and is inserted into a feed-through hole 49 where it is soldered to the metallized housing 16. The input tab 13 is adhered to the housing 16. Control screws for gain and saturation level are inserted at 52 and 54, respectively.

In one method of performing the prior art plating process, the housing 16, the retainer ring 29, and the flange 30 are electroplated to form a continuous conductive coating of metallic material. However, prior to the plating, a chemical mask is used in certain areas, including the perimeter of tab 13 (see FIG. 1), and the interior surface of the housing (see FIG. 4) to prevent plating in these regions. The capacitors and power input tab 13 are joined to the housing 16 and the leads joined to the power supply 12. The tube assembly is then put into the housing 16 and the space between the assembly and housing is filled with a nonconductive potting compound. Additional potting compound is added to the tube.

Figure 5:
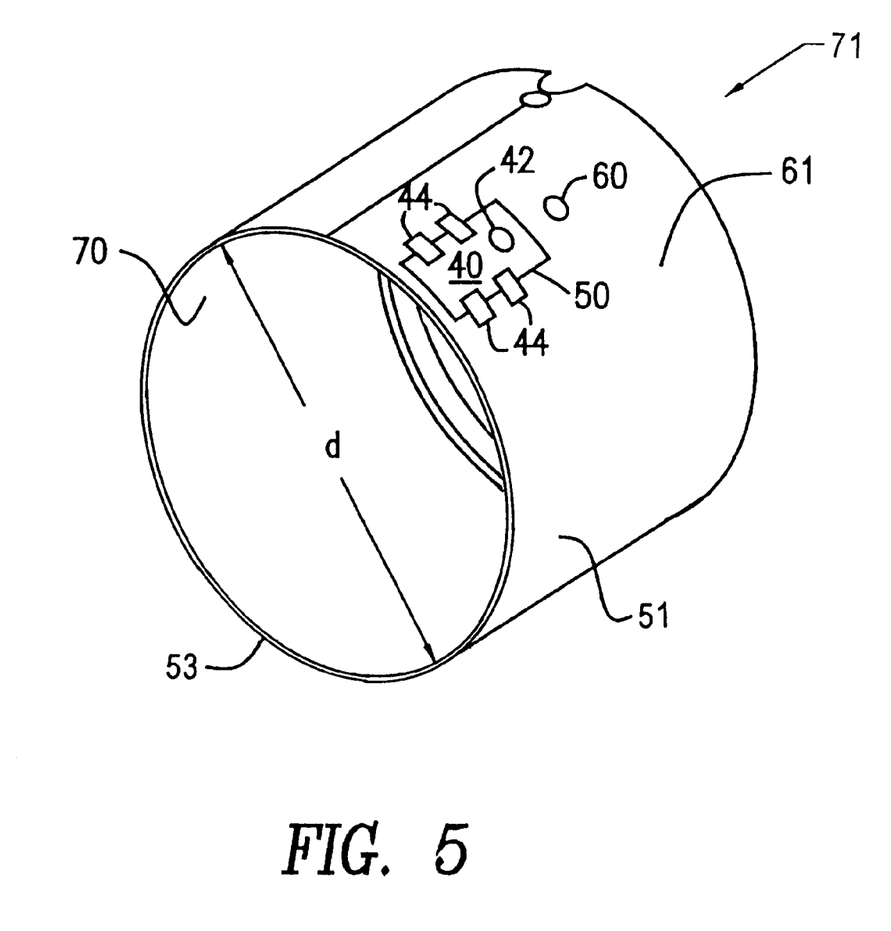
FIG. 5 is a perspective view of the housing assembly of the present invention.

Referring now to FIG. 5, there is shown a perspective view of a preferred embodiment of the image intensifier tube housing assembly 71 of the present invention. In referring to the drawings illustrating the present invention, like parts are indicated by like reference numerals. The present invention eliminates the need to use a chemical masking agent in the plating process. In addition, the present invention eliminates the need for a separate, solderable positive contact area within the housing. The housing assembly of the present invention comprises a hollow substantially cylindrical tube 53 of uniform diameter d for receiving an image intensifier. As in the prior art, the tube is made of a non-conductive material such as plastic. The tube has a cylindrical outer surface 51 which is uniformly plated with a conductive material to shield the image intensifier tube from electromagnetic interference and forms (i.e. defines) a negative contact area 61. The conductive material may include a variety of metals such as tin, copper and nickel, to provide both electrical- conductivity and shielding, as is well known in the art.

Figure 5A:
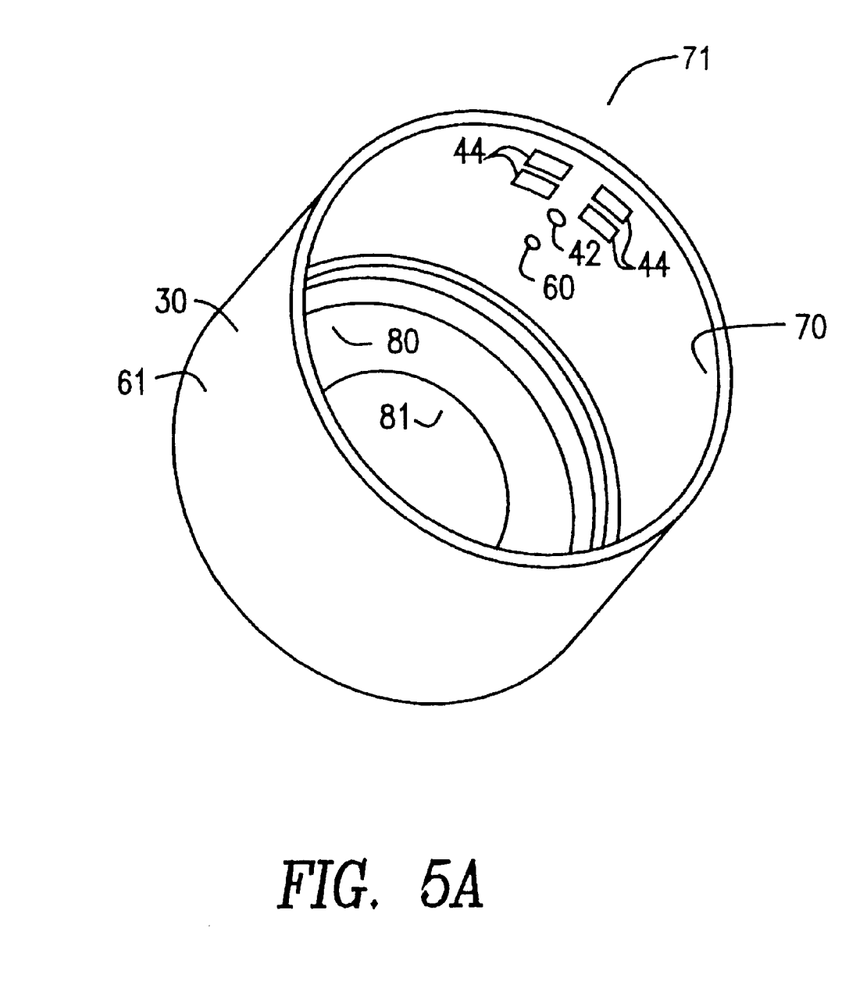
FIG. 5A is a perspective view of the housing assembly of the present invention showing the interior of the housing tube.
Figure 5B:
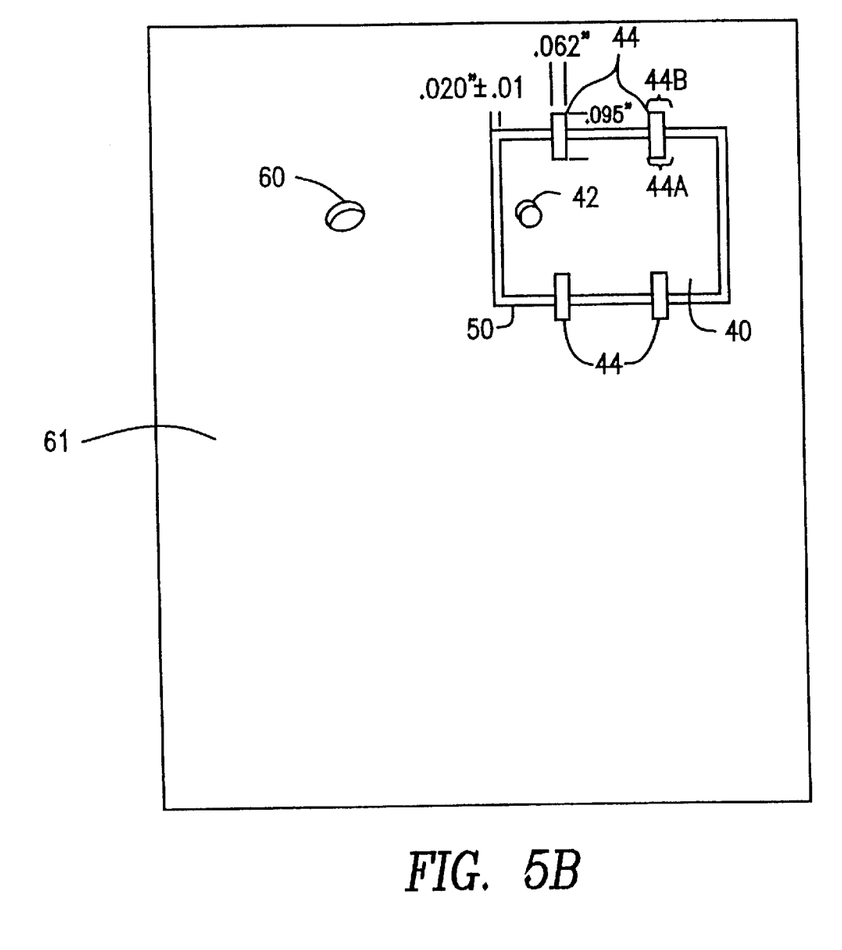
FIG. 5B is a detailed view of the tube housing of the present invention shown in FIG. 5.
Figure 6:
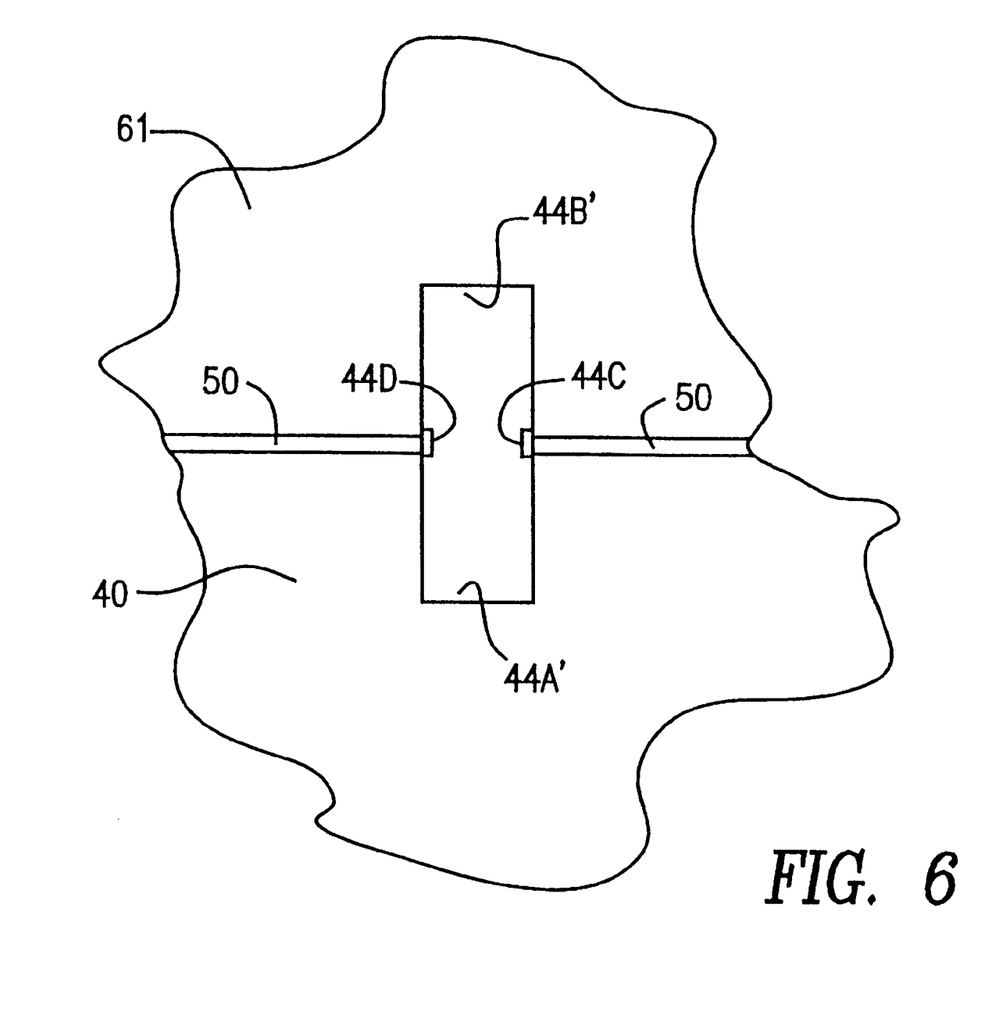
FIG. 6 is an expanded view of a slot hole shown in FIG. 5.

A second circular portion 80, having an aperture 81 (shown in FIG. 5A), integrally extends from and is perpendicular to cylindrical outer surface 51 to prevent egress of the image intensifier when it is placed inside the housing. However, unlike the prior art, the outer surface 51 also includes a positive contact area 40 defined by a closed loop rectangular segment 50, which is unplated. In the preferred embodiment, a machining tool is used to mill the plated conductive material from the outer surface to form the unplated closed loop rectangular segment 50. In this manner, the positive contact area 40 is formed within the rectangle and is electrically isolated from the negative contact area 61 located outside the rectangular area, thereby eliminating the need for a separate contact soldered to the housing. As can be ascertained, the positive contact area 40 is thus also uniformly plated since it is formed out of the overall uniformly plated outer surface 51. A negative feed through hole 60 is located within the negative contact area 61 for receiving a negative lead from the image intensifier power supply. A corresponding positive feed through hole 42 is located within the positive contact area 40 for receiving a positive lead from the power supply. Preferably, four discrete slot holes (44) are formed along rectangular segment 50 having portions (e.g. 44A and 44B) extending into the corresponding positive and negative contact areas, respectively. A detailed view of the present inventive tube housing including the relevant positive and negative contact areas is shown in FIG. 5B. Each of the slot holes 44 are formed to receive a discrete capacitor which is joined (preferably soldered) to the housing on the interior surface 70 of the tube to short the EMI from the positive contact area 40 to the negative contact area 61. In the preferred embodiment, the slot holes are formed before the shielding has been applied to the outer surface and before the machining operation to remove the plating to form segment 50 occurs. FIG. 6 is an expanded view of a slot hole 44. Referring to FIG. 6, the resulting slot hole, after machining segment 50 and through the slot, thus comprises unplated inner surface portions 44C and 44D which are in contact with and separate plated respective positive and negative inner surface portions 44A' and 44B'.

Figure 7:
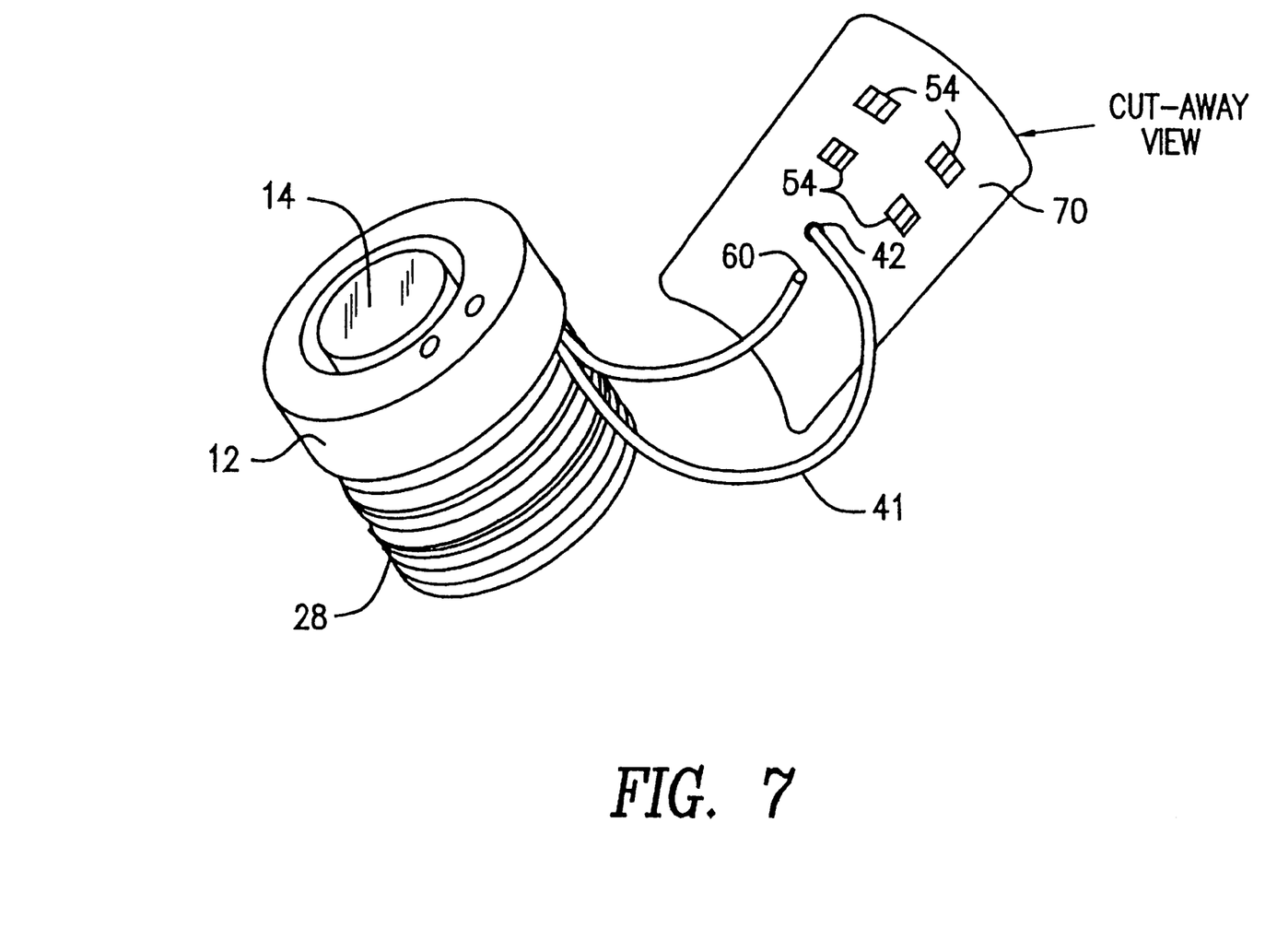
FIG. 7 shows the arrangement for the filtering of the tube assembly of the present invention including a cut-away view of the housing.

FIG. 7 shows the arrangement for the filtering of the tube assembly. Referring now to FIG. 7, four discrete 0.01 uF capacitors 54 are positioned within each of the slot holes 44 of the tube housing 53 and soldered at the interior surface 70. Positive lead 41 extends between the power supply 12 through feed through hole 42 and is soldered to the positive contact area 40 on the outer surface (not shown). The negative lead 62 extends between the power supply 12 and is inserted into feed through hole 60 where it is soldered to negative contact area 61 on the outer surface (not shown).

In the preferred embodiment, rectangular segment 50 is created by machining a line of 0.020±0.01 inches wide and no more than 0.010 inches deep to remove the conductive plating. The machined line segment passes through the center of slot holes 44 having preferred dimensions of 0.062" by 0.095", as shown in FIG. 5B. The width and depth of the machined rectangular segment 50 has been found to be of sufficient dimension to provide EMI protection and isolation for a power supply providing 3 volt DC operating power.

A method for making the inventive housing assembly for providing EMI protection with an integrated positive contact area is now described. Referring again to FIG. 5, the housing assembly tube 53 is formed of a non-conductive material such as plastic. A plurality of slot holes 44 are then formed in the tube along with a pair of feed through holes (60 and 42) using conventional drilling means. A plug (not shown) made of a malleable protective material such as rubber (or rubber-like material) having the same dimensions as the inner diameter d of the tube is then placed within the interior of the housing assembly tube 20 to fill the tube so as to prevent plating of the interior surface 70 of the tube. The outer surface 51 and outer surface of circular portion 80 is then electroplated to form a continuous conductive coating of metallic material defining a negative contact area 61. The metallic material may comprise a combination of metals including copper, tin and nickel, or other alloys capable of providing high conductivity and shielding properties. A portion of the plated outer surface is then machined using conventional techniques to remove the plated coating to form unplated closed loop segment 50 which defines a positive contact area 40 containing feedthrough hole 42, and which is electrically isolated from the negative contact area 61 outside the line segment 50. In the preferred embodiment, the unplated segment 50 is created by machining a line of 0.020±0.01 inches wide and no more than 0.010 inches deep. The machined line segment passes through the center of slot holes 44, which in the preferred embodiment, have dimensions of 0.062" by 0.095". The slot holes 44 thus extend through the line segment 50 to contact both the positive contact area 40 and negative contact area 61. The inner diameter plug is then removed and capacitors 54 (referring now to FIG. 7) are inserted into the slot holes 44 and soldered to the interior surface 70 for shorting the EMI from the positive contact area 40 to the negative contact area 61. The image intensifier including its power supply 12 is then placed within the interior of the housing assembly tube and the negative voltage lead 62 is inserted through feed through hole 60 and joined to negative contact area 61. Similarly, the positive voltage lead 41 is fed through feed through hole 42 and joined to positive contact area 40. Both voltage leads are soldered to the conductively plated outer surface of the housing. The space between the image intensifier and housing is filled with a nonconductive potting compound. A non-conductive adhesive (UV cure) is applied to the inside of the tube around the capacitors to both seal the space around the capacitor filled holes and provide secure physical adhesion of the capacitors to the housing.

As can be readily ascertained, the present method for shielding the image intensifier device permits the housing to be plated without the need for a chemical masking process. The inner diameter plug is used to hold the housing during the plating operation which prevents the plating of the inside of the housing and the machining operation removes the plating from around the positive contact area and capacitor areas to create an electrically separated positive contact out of the plated surface of the housing. This eliminates the need for the separate gold plated positive contact and intricate lip support and installation within the housing.

While there has been shown preferred embodiments of the present invention, those skilled in the art will further appreciate that the present invention may be embodied in other specific forms without departing from the spirit or central attributes thereof. For example, the rectangular unplated circuit 50 defining the positive contact area may be replaced with another geometric circuit shape, such as an oval or triangular circuit, in order to facilitate the machining process. Similarly, the slot holes and corresponding capacitors may be replaced by a single capacitor (and slot hole) or any number of capacitors having a capacitance sufficient to short the EMI. The concept and central attributes embodying the invention could be used on any format tube, as well as other EMI shielded devices using plated plastic as electrical contacts. All such variations and modifications are intended to be within the scope of this invention as defined by the appended claims.

What is claimed is:

1. A housing assembly for an electronic device for providing electromagnetic interference (EMI) protection and positive and negative contact areas, said housing comprising a hollow substantially cylindrical tube of uniform diameter for receiving said electronic device, said tube having:
    a first cylindrical outer surface comprising
        a first conductively plated portion defining a negative contact area,
        a second conductively plated portion defining a positive contact area,
        a plurality of slot holes in said second portion and extending into said first portion for receiving capacitive elements to provide EMI protection for said electronic device, and
    first and second bore holes located in said respective first portion and said second portion for receiving corresponding negative and positive voltage terminals from said electronic device.

2. The housing assembly of claim 1, wherein said electronic device is an image intensifier.

3. The housing assembly of claim 1, wherein said tube is plastic.

4. The housing assembly of claim 1, wherein said positive and negative voltage terminals provide a 3 volt DC potential, and wherein said capacitive elements are soldered to the interior of said tube.

5. The housing assembly of claim 1, wherein said first and second conductively plated portions comprise a nickel, tin, copper alloy.

6. The housing assembly of claim 1, further comprising an unplated segment located between said second portion and said first portion, said unplated segment being rectangular shaped and having dimensions of 0.010–0.030 inches wide and up to 0.010 inches deep, wherein said unplated segment electrically insulates said second portion from said first portion.

7. The housing assembly of claim 1, wherein said plurality of slot holes is four.

8. The housing assembly of claim 7, wherein each of said slot hole is transected by an unplated segment located between said second portion and said first portion, wherein said unplated segment passes through the center of each of said slot hole perpendicular to the length of each of said slot hole.

9. A housing assembly for an electronic device for providing electromagnetic interference (EMI) protection and positive and negative contact areas, said housing comprising a hollow substantially cylindrical tube of substantially uniform diameter for receiving said electronic device, said tube comprising:
    a first cylindrical outer surface comprising:
        a first conductively plated portion defining a negative contact area,
        a second portion defining a positive contact area,
        a plurality of slot holes in said second portion and extending into said first conductively plated portion for receiving capacitive elements to provide EMI protection for said electronic device, and
        first and second bore holes located in said respective first conductively plated portion and said positive contact area for receiving corresponding negative and positive voltage terminals from said electronic device; and
    a second circular outer surface conductively plated and integrally extending from said first cylindrical outer surface to prevent egress of said electronic device.

10. An image intensifying device comprising: a photocathode, a phosphor screen, a microchannel plate, and a housing for holding said photocathode, phosphor screen and said microchannel plate, for providing electromagnetic interference (EMI) protection, and for providing positive and negative contact areas, said housing comprising a substantially cylindrical tube of a unitary structure having a first cylindrical outer surface comprising:

a first conductively plated portion defining a negative contact area;

a second conductively plated portion defining a positive contact area; and an unplated segment located between said first conductively plated portion and said second conductively plated portion;

wherein said unplated segment electrically insolates said second conductively plated portion from said first conductively plated portion.

11. The image intensifying device of claim 10, wherein said cylindrical tube further comprises:

a plurality of slot holes in said second conductively plated portion and extending into said first conductively plated portion for receiving capacitive elements to provide EMI protection for said image intensifying device; and first and second bore holes located in said respective first conductively plated portion and said second conductively plated portion for receiving corresponding negative and positive voltage terminals from said electronic device.

12. The image intensifying device of claim 11, wherein said slot holes are substantially 0.062 inches wide and substantially 0.095 inches in length.

13. The image intensifying device of claim 12, wherein said unplated segment passes through the center of said slot holes perpendicular to the length of said slot holes.

14. The image intensifying device of claim 10, wherein said substantially cylindrical tube is made of a non-conducting material.

15. The image intensifying device of claim 14, wherein said unplated segment has a depth of no more than 0.01 inches.

16. The image intensifying device of claim 10, wherein said first and second conductively plated portions are plated with a material containing at least one of nickel, tin, and copper.

17. The image intensifying device of claim 10, wherein said unplated segment has a width of 0.01 inches to 0.03 inches.

* * * * *